(12) United States Patent
Aghaeepour

(10) Patent No.: US 7,019,547 B2
(45) Date of Patent: Mar. 28, 2006

(54) PIN DRIVER FOR AC AND DC SEMICONDUCTOR DEVICE TESTING

(75) Inventor: Farrokh Aghaeepour, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/988,765

(22) Filed: Nov. 15, 2004

(65) Prior Publication Data

US 2005/0088197 A1    Apr. 28, 2005

Related U.S. Application Data

(63) Continuation of application No. 10/323,441, filed on Dec. 18, 2002, now Pat. No. 6,836,136.

(51) Int. Cl.
*G01R 31/26*    (2006.01)

(52) U.S. Cl. .................. 324/765; 324/73.1; 324/158.1

(58) Field of Classification Search ............... 324/73.1, 324/537, 764–765, 158.1; 714/724, 726, 714/738

See application file for complete search history.

(56) References Cited

U.S. PATENT DOCUMENTS

| | | | |
|---|---|---|---|
| 4,517,512 A | 5/1985 | Petrich et al. | 714/724 |
| 5,101,153 A | 3/1992 | Morong, III | 324/537 |
| 5,436,559 A * | 7/1995 | Takagi et al. | 324/158.1 |
| 5,467,024 A | 11/1995 | Swapp | 324/771 |
| 6,133,725 A * | 10/2000 | Bowhers | 324/158.1 |
| 6,331,783 B1 * | 12/2001 | Hauptman | 324/765 |
| 6,404,220 B1 | 6/2002 | Hashimoto | 324/765 |
| 6,836,136 B1 * | 12/2004 | Aghaeepour | 324/765 |
| 6,856,158 B1 * | 2/2005 | Frame et al. | 324/765 |

* cited by examiner

Primary Examiner—Minh N. Tang

(57) ABSTRACT

A pin electronics circuit for use in automatic test equipment is disclosed. The pin electronics circuit includes a pin driver having an output adapted for coupling to a device-under-test pin, and a first input. AC input circuitry couples to a pattern generator to receive pattern test signals while DC input circuitry connects to a DC parametric controller. Selector circuitry selectively couples the AC and DC input circuitry to the pin driver first input.

12 Claims, 3 Drawing Sheets

PIN DRIVER FOR AC AND DC SEMICONDUCTOR DEVICE TESTING

This is a continuation of application Ser. No. 10/323,441, filed Dec. 18, 2002, now U.S. Pat. No. 6,836,136.

FIELD OF THE INVENTION

The invention relates generally to automatic test equipment, and more particularly to pin electronics circuits for automatic test equipment applications.

BACKGROUND OF THE INVENTION

Automatic test equipment plays a key role in the manufacture of semiconductor devices. More commonly called "testers", the equipment allows manufacturers to test each device for engineering characterization and/or production validation. Ensuring that every device entering commerce "works" is critical for the continued success of a semiconductor device manufacturer.

Unfortunately for the device manufacturer, test comes at a price. Typically, the more complex the device-under-test (DUT), the higher the cost to test it. Cost of test is one of the more important factors in deciding the type of tester to employ in the factory.

Much of the cost of a semiconductor tester is wrapped into the channel architecture. A channel may be thought of as the electronic resources in the tester that interface with one pin of the device-under-test (DUT). If the DUT pins require high performance and high accuracy test signals in order to adequately test the part, each channel may require a host of costly enabling features to achieve the performance. On the other hand, a channel architecture may be greatly simplified, and less costly, if the performance parameters are low.

Typically, as shown generally in FIG. 1, the conventional channel architecture for a semiconductor tester includes AC test circuitry in the form of an AC driver 10 responsive to a pattern generator 12, and DC test circuitry including a DC parametric measurement unit 14. Generally, the AC driver generates and drives AC and test waveforms along a transmission line 16 to a DUT 18, while the DC test circuitry forces a DC voltage or current to the DUT and performs various DC measurements. Usually, tests are performed on the tester at separate times.

Referring now to FIG. 2, which illustrates the conventional channel architecture in further detail, the AC driver circuitry 10 couples to the DUT 18 via the transmission line 16 with a complementing comparator circuit 20. The comparator circuit captures signals from the DUT 18 that are generated in response to the AC driver waveforms. The captured signals are then compared to expected signals to determine whether the DUT functioned as expected.

Further referring to FIG. 2, the DC test circuitry 14 comprises a separate circuit known as a per-pin-parametric-unit, or PPMU. The unit employs an amplifier 22 responsive to a multiplexer 24 that selectively provides one of two DC levels Vin1 (a forcing voltage level) or Vin2 (a "safe" voltage such as ground). A register 26 provides the control signal input to the multiplexer. Disposed at the output of the amplifier is a current measuring circuit comprising a second amplifier 28 with a current sense resistor R. In general, the PPMU provides a force/measurement functionality for DC voltage and current testing of the DUT 18. Consequently, because of its inherent DC characteristics, the PPMU is typically a low-cost circuit.

While this general architecture works well for its intended applications, the cost and size of the hardware to realize the separate AC and DC driver circuits 10 and 14 is often prohibitive for very low-cost and low-performance testers, such as design-for-test (DFT) testers. Thus, the need exists for a low-cost channel architecture for low-cost and low-performance testers. The pin driver circuit of the present invention satisfies these needs.

SUMMARY OF THE INVENTION

The pin driver circuit of the present invention provides a cost effective way to achieve AC and DC tests and reduce the cost of support circuitry, such as level generation circuitry. Tester board area optimization is also realized. This is accomplished by modifying a conventional PPMU circuit to enable dual AC and DC test functionality.

To realize the foregoing advantages, the invention in one form comprises a pin electronics circuit for use in automatic test equipment. The pin electronics circuit includes a pin driver having an output adapted for coupling to a device-under-test pin, and a first input. AC input circuitry couples to a pattern generator to receive pattern test signals while DC input circuitry connects to a DC parametric controller. Selector circuitry selectively couples the AC and DC input circuitry to the pin driver first input.

In another form, the invention comprises a method of applying test signals with a pin driver to a semiconductor device pin. The method includes the steps of: (a) selecting an AC test mode; (b) conducting the AC test by applying AC signals to the pin driver to generate AC output test signals from the pin driver, and driving the AC output test signals from the pin driver to the device pin. The method continues by (c) selecting a DC test mode, (d) conducting the DC test by performing DC parametric measurements on the device-under-test.

In a further form, the invention comprises a pin electronics circuit for use in automatic test equipment. The pin electronics circuit includes means for driving test waveforms to a device-under-test pin, the means for driving having an output for coupling to the pin, and an input. AC input circuitry means couples to a pattern generator to receive pattern test signals while DC input circuitry means connects to a DC parametric controller. The pin electronics circuit further includes means for selectively coupling the AC and DC input circuitry means to the means for driving input.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
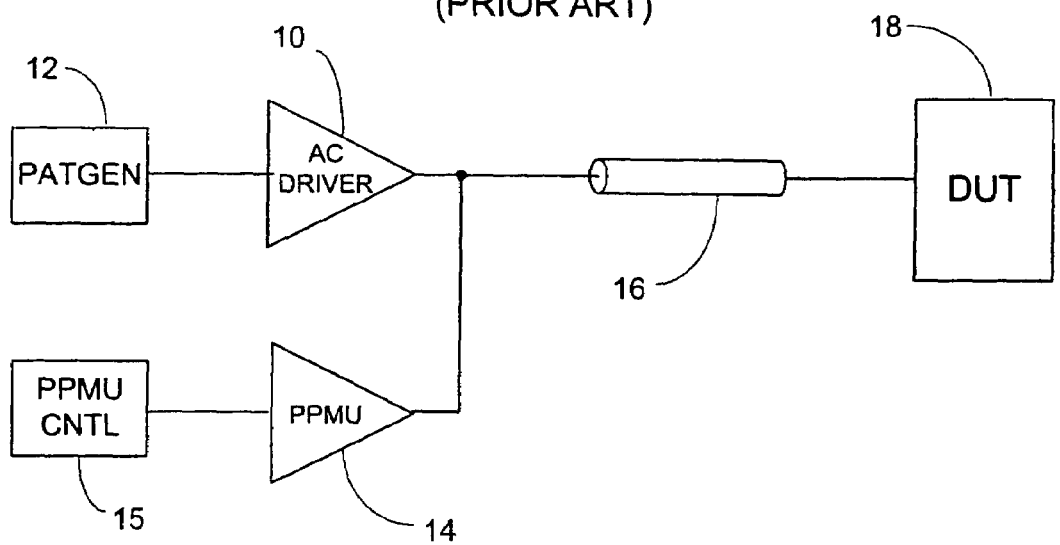
FIG. 1 is a high level block diagram of a conventional channel architecture for a semiconductor tester.
Figure 3:
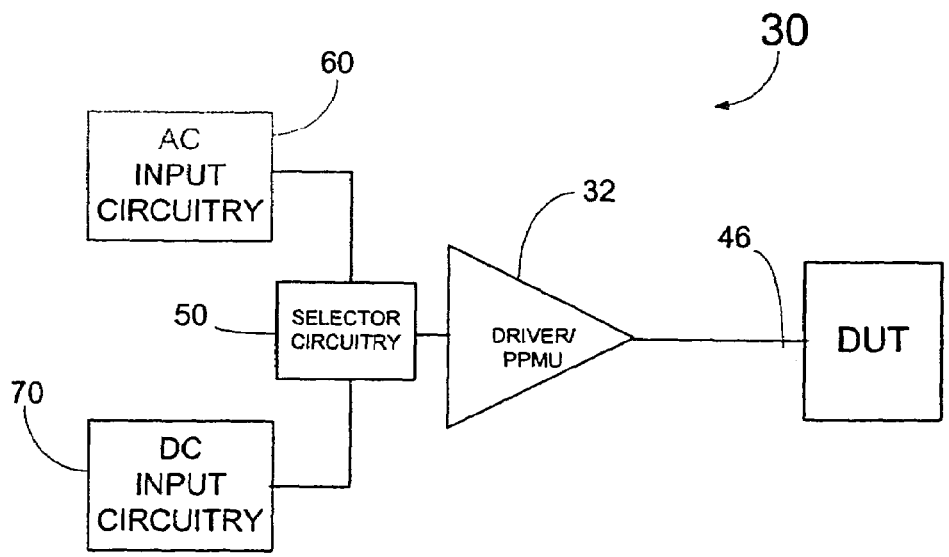
FIG. 3 is a high level block diagram of a pin driver circuit according to one form of the present invention.
Figure 2:
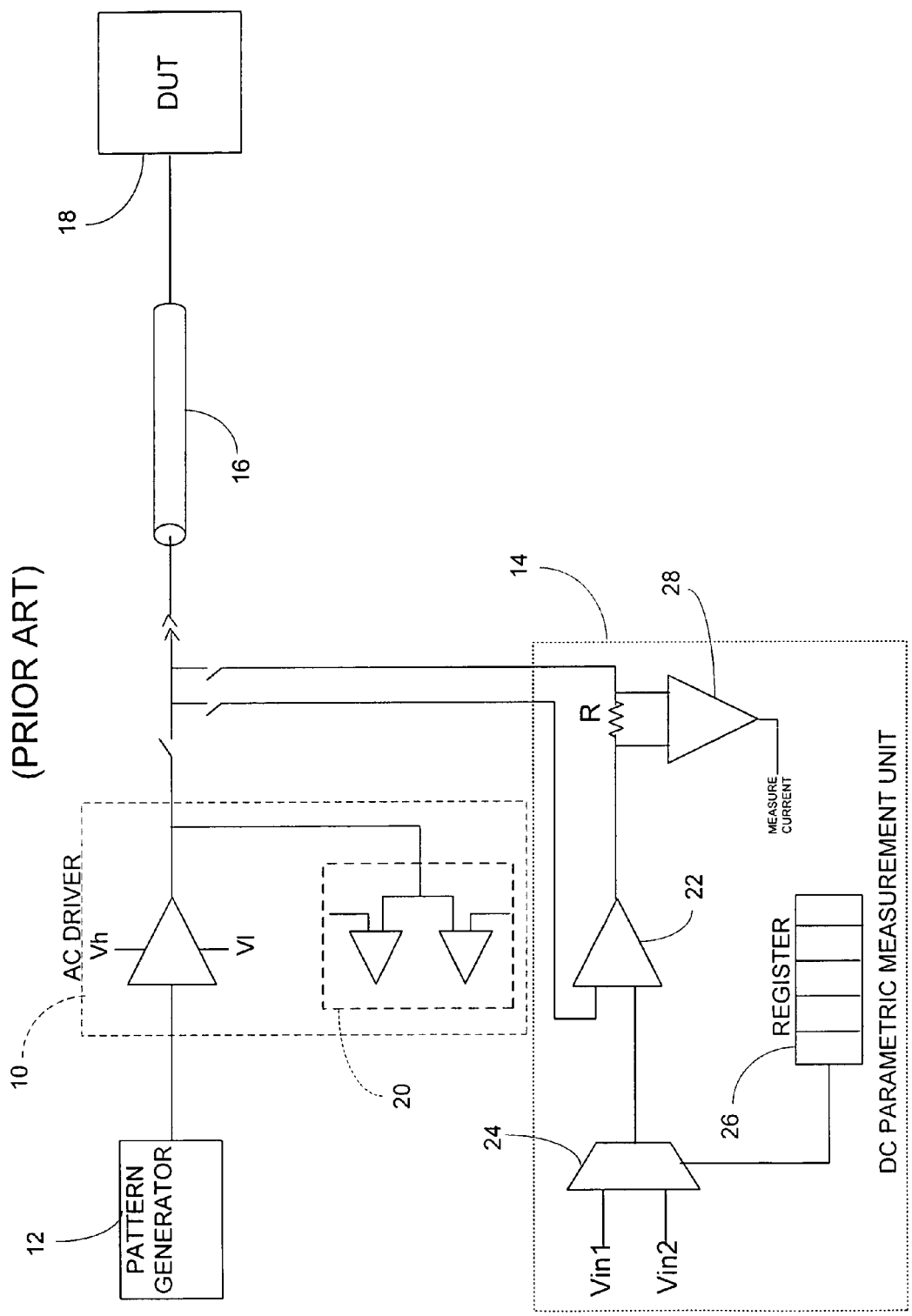
FIG. 2 is a more detailed block diagram of the conventional channel architecture of FIG. 1.

The pin electronics in a semiconductor tester provide an important role in interfacing the tester to the pins of a device-under-test (DUT). Referring to FIG. 3, the pin driver circuit of the present invention, generally designated 30, employs a driver 32 having an output coupled to a DUT pin 46. The driver input couples to AC input circuitry 60 and DC input circuitry 70. Selector circuitry 50 interposed between the AC/DC circuitry and the pin driver input selectively steers AC or DC test signals to the pin driver. With this construction, a single pin driver is able to provide both AC waveforms and DC parametric tests to the DUT pin.

Figure 4:
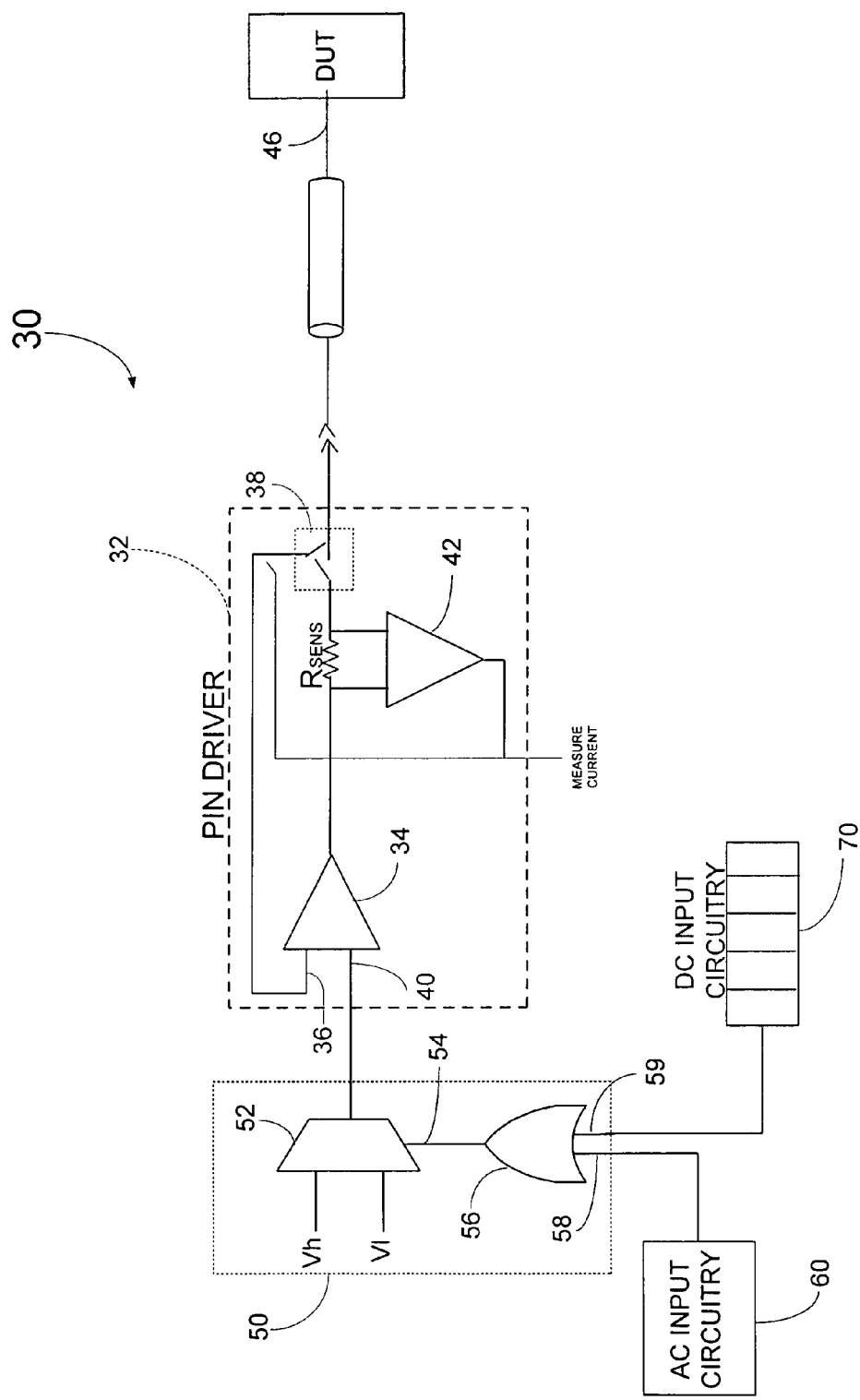
FIG. 4 is a more detailed block diagram of the pin driver circuit of FIG. 3.

With reference to FIG. 4, which illustrates the pin driver circuit of the present invention in further detail, the driver 32 includes a first amplifier 34 having an output resistance switchably coupled to the DUT pin 46. A first input to the amplifier, at 36, is fed back to the amplifier output through a switching circuit 38 to provide a voltage force and measurement capability. A second input to the amplifier, at 40, couples to the selector circuitry 50 to receive AC or DC test signals.

Disposed in series with the first instrumentation amplifier output is a current sense resistor $R_{sens}$ having its terminals bounded by the inputs of a second amplifier 42. The second amplifier and sense resistor cooperate to form a current measurement circuit, as is well-known in the art.

The amplifiers 34 and 42 employed for the pin driver circuit 30 of the present invention are of the low-cost variety, exhibiting relatively low performance parameters for low performance applications. For example, pulse widths on the order of a microsecond are envisioned to support AC testing in the low megahertz frequencies. More specifically, the inventor has unexpectedly discovered that with modifications to the input circuitry, described more fully below, much of the conventional DC PPMU circuitry may be employed for low performance AC test signal generation. Applications that may benefit the most from this low-cost approach include design-for-test (DFT) test methods that often rely on low frequency voltage waveforms.

Further referring to FIG. 4, to enable the multifunctional AC and DC nature of the present invention, the selector circuitry 50 includes a 2:1 multiplexer 52 having a plurality of voltage level inputs (such as Vhi and Vlow) and a control input 54 coupled to the output of an OR gate 56. One of the two inputs to the OR gate, at 58, couples to the AC input circuitry 60 while the second OR gate input, at 59, connects to the DC input circuitry 70.

In a preferred embodiment, the AC input circuitry 60 comprises a pattern generator. As is well-known in the art, the pattern generator generally provides an alternating digital signal source responsive to a pre-programmed vector memory (not shown). The DC input circuitry 70, on the other hand, preferably comprises a memory or register pre-programmed to set desired DC voltage or current level test setup modes (such as a force voltage versus a safe zero level) for application to the multiplexer 52 at specified times during a DC test.

In practice, an array of pin driver circuits 30 as described above are implemented in multiple channels on a single application-specific-integrated-circuit (ASIC). Several ASICs, in turn, are usually employed on multiple circuit boards in the tester testhead (not shown) to support the overall test. Because of the dual AC and DC functionality realized by the pin driver circuit 30 of the present invention, the area in the ASIC reserved for the driver circuitry is substantially reduced. The inverse to this is that more channel circuitry may be included in a given ASIC because of the pin driver multifunctionality.

As described briefly above, the present invention is constructed to support both AC and DC testing of a DUT. For AC tests, the AC input circuitry 60 supplies a stream of digital control signals to the multiplexer control input 54 such that the multiplexer output alternates between Vh and Vl. The net effect is an alternating test waveform fed to the driver 32 in the low megahertz range. The driver, in turn, produces a corresponding impedance-matched output test signal for application to the DUT pin 46.

DC testing may involve one of several modes, such as force voltage measure current (FVMI) or force current measure voltage (FIMV). In the FVMI mode, the register supplies a control signal for the multiplexer to select from one of the two voltage levels and apply the voltage in steady state to the input of the driver 32. The driver then forces a corresponding voltage to the DUT pin 46. The resulting current is then sensed across the sense resistor Rsens by the current sense amplifier 42 for the current measurement information. In the FIMV mode, the current is generated across the sense resistor and forced to the DUT pin 46. The feedback input to the driver is then switched to an ON state to enable the driver 32 to compare the resulting detected voltage to one of the selected voltage levels (Vh or Vl). Of course, for a device having upwards of 512 or 1024 pins, a corresponding number of channel PPMU circuits perform the operations described above in parallel.

Those skilled in the art will appreciate the many benefits and advantages afforded by the present invention. Of significant importance is the low cost achievable by enabling dual AC and DC functionality in a single pin electronics circuit. While this significantly reduces cost, another benefit results from the corresponding reduction in footprint realized by the overall reduction in driver circuitry, such as support circuits for level generation, necessary to carry out the AC and DC testing.

While the invention has been particularly shown and described with reference to the preferred embodiments thereof, it will be understood by those skilled in the art that various changes in form and detail may be made therein without departing from the spirit and scope of the invention.

What is claimed is:

1. A pin electronics circuit for use in automatic test equipment, the pin electronics circuit including:
   a pin driver having an output adapted for coupling to a device-under-test pin, and a first input; and
   selector circuitry configured to selectively couple AC input circuitry and DC input circuitry to the first input.

2. The pin electronics of claim 1, further comprising a current measurement amplifier disposed at the output of the pin driver.

3. The pin electronics of claim 1 wherein the pin driver comprises a second input fed back to the pin driver output.

4. The pin electronics of claim 1 wherein the selector circuitry comprises:
   a multiplexer having an output coupled to the first input, a control input, and a pair of signal level inputs, and
   logic circuitry having a first input coupled to the AC input circuitry and a second input coupled to the DC input circuitry.

5. The pin electronics of claim 4 wherein the logic circuitry comprises an OR gate.

6. The pin electronics of claim 1 wherein the AC input circuitry comprises a pattern generator.

7. The pin electronics of claim 1 wherein the DC input circuitry comprises a register.

8. The pin electronic circuit of claim 1 wherein the AC input circuitry is adapted for coupling to a pattern generator to receive pattern test signals.

9. The pin electronic circuit of claim 1 wherein the DC input circuitry is adapted for coupling to a DC parametric controller.

10. A pin electronics circuit for use in automatic test equipment, the pin electronics circuit comprising:
   means for driving test waveforms to a device-under-test pin, the means for driving having an output for coupling to the pin, and an input; and
   means configured to selectively couple AC input circuitry and DC input circuitry to the input of the means for driving.

11. The pin electronics circuit of claim 10 wherein the DC input circuitry is adapted for coupling to a DC parametric controller.

12. The pin electronics circuit of claim 10 wherein the AC input circuitry is adapted for coupling to a pattern generator to receive pattern test signals.

* * * * *